US011411583B2

(12) United States Patent
Lee et al.

(10) Patent No.: US 11,411,583 B2
(45) Date of Patent: Aug. 9, 2022

(54) DEINTERLEAVING METHOD AND DEINTERLEAVING SYSTEM PERFORMING THE SAME

(71) Applicant: ELECTRONICS AND TELECOMMUNICATIONS RESEARCH INSTITUTE, Daejeon (KR)

(72) Inventors: Seung-Woo Lee, Daejeon (KR); Hun Sik Kang, Daejeon (KR); In Ki Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/199,605

(22) Filed: Mar. 12, 2021

(65) Prior Publication Data

US 2021/0314003 A1    Oct. 7, 2021

(30) Foreign Application Priority Data

Apr. 3, 2020    (KR) .................. 10-2020-0041095

(51) Int. Cl.
*H03M 13/27* (2006.01)
*H03M 13/11* (2006.01)

(52) U.S. Cl.
CPC ... *H03M 13/2778* (2013.01); *H03M 13/1105* (2013.01); *H03M 13/1148* (2013.01); *H03M 13/2717* (2013.01)

(58) Field of Classification Search
CPC .................. H03M 13/2778; H03M 13/2717
See application file for complete search history.

(56) References Cited

U.S. PATENT DOCUMENTS

| 4,433,415 | A  | * | 2/1984  | Kojima  | G11B 20/1809 |
| 5,392,299 | A  | * | 2/1995  | Rhines  | H03M 13/31   |
|           |    |   |         |         | 714/755      |
| 5,719,875 | A  | * | 2/1998  | Wei     | H03M 13/23   |
|           |    |   |         |         | 714/701      |
| 6,381,728 | B1 | * | 4/2002  | Kang    | H03M 13/2775 |
|           |    |   |         |         | 714/795      |
| 6,625,763 | B1 | * | 9/2003  | Boner   | H03M 13/2703 |
|           |    |   |         |         | 714/701      |
| 7,170,849 | B1 | * | 1/2007  | Arivoli | H04L 1/0071  |
|           |    |   |         |         | 370/208      |
| 9,819,445 | B1 | * | 11/2017 | Patel   | H04L 1/0071  |
| 9,876,512 | B2 |   | 1/2018  | Park et al. |          |
| 10,097,209| B2 |   | 10/2018 | Zhang et al. |         |
| 10,284,228| B2 |   | 5/2019  | Lim et al. |           |

(Continued)

FOREIGN PATENT DOCUMENTS

KR    100584426 B1    5/2006
KR    100764011 B1    10/2007

*Primary Examiner* — Joseph D Torres
(74) *Attorney, Agent, or Firm* — Rabin & Berdo, P.C.

(57) ABSTRACT

A deinterleaving method and a deinterleaving system performing the same are disclosed. According to an example embodiment, a data processing method includes dividing data into first data blocks of a first number of bits, performing deinterleaving on the first data blocks, and dividing deinterleaved data into second data blocks of a second number of bits and outputting the second data blocks, wherein the first number of bits is determined based on a minimum switching unit of a deinterleaving operation and the second number of bits.

15 Claims, 9 Drawing Sheets

(56) References Cited

U.S. PATENT DOCUMENTS

| | | | |
|---|---|---|---|
| 2004/0117716 A1* | 6/2004 | Shen | H03M 13/2957 |
| | | | 714/776 |
| 2009/0164868 A1* | 6/2009 | Anand | H04L 1/0071 |
| | | | 714/790 |
| 2009/0249134 A1* | 10/2009 | RostamPisheh | H03M 13/6566 |
| | | | 711/E12.002 |
| 2011/0078540 A1* | 3/2011 | Hu | H03M 13/6331 |
| | | | 714/763 |
| 2015/0341047 A1 | 11/2015 | Park et al. | |
| 2017/0359208 A1* | 12/2017 | Wang | H04L 69/22 |

* cited by examiner

FIG. 5

DEINTERLEAVING METHOD AND DEINTERLEAVING SYSTEM PERFORMING THE SAME

CROSS-REFERENCE TO RELATED APPLICATION(S)

This application claims the benefit of Korean Patent Application No. 10-2020-0041095, filed on Apr. 3, 2020, in the Korean Intellectual Property Office, the disclosure of which is incorporated herein by reference.

BACKGROUND

1. Field of the Invention

One or more example embodiments relate to a deinterleaving method and a deinterleaving system performing the same.

2. Description of the Related Art

In forward error correction (FEC), which is widely used, a low-density parity-check (LDPC) code is an error correction code widely used in wireless communication. Recently, there are increasing efforts to improve performance by applying the LDPC code to optical communication. As an error correction decoder algorithm used in the LDPC code, an iterative algorithm called a belief propagation algorithm and a sum-product algorithm is used.

If the number of burst errors is greater than the limit to be processed by the decoding algorithm, the error correction decoder may not operate normally. In this case, an interleaving technique may be used as a method of distributing burst errors such that errors to be processed are distributed instead of being concentrated in one code block unit. Namely, interleaving is an effective technique for processing burst errors, which distributes successive errors in one code block unit into several code words, thereby significantly reducing the number of errors in each code. The error correction decoder may process a code of an error range within the processing limit, thereby improving an error recovery function.

Transmission performance may be improved by distributing errors based on the interleaving technique. Also, an error rate may be effectively reduced by applying the interleaving technique to an LDPC decoder for data transmission.

The interleaving technique includes deinterleaving to restore an original bit sequence order of interleaved data.

SUMMARY

An aspect provides, in implementing an interleaver and a deinterleaver, a technology for reducing switching and routing between bits in the interleaver and the deinterleaver.

According to an aspect, there is provided a method of processing data, the method including dividing data into first data blocks of a first number of bits, performing deinterleaving on the first data blocks, and dividing deinterleaved data into second data blocks of a second number of bits and outputting the second data blocks, wherein the first number of bits is determined based on a minimum switching unit of a deinterleaving operation and the second number of bits.

The second number of bits may be an input data unit of a low-density parity-check (LDPC) decoder.

The first number of bits may be a common multiple of the minimum switching unit and the second number of bits.

The performing may include inputting the first data blocks in sequence and realigning inputted respective data blocks based on the minimum switching unit.

The realigning may include mapping bits having intervals of the minimum switching unit among bits of the respective data blocks to each row of a new data matrix.

The data may be data obtained by performing interleaving.

According to another aspect, there is also provided a method of processing data, the method including inputting first data through M-th data, each having N bits, N and M being natural numbers greater than or equal to 1, generating a first data matrix through an M-th data matrix by extracting bits at an interval of K bits for each of the first data through the M-th data, K being a natural number greater than or equal to 1, and sequentially outputting an L-th row of each of the first data matrix through the M-th data matrix, L being a natural number greater than or equal to 1.

N may be a multiple of K, and the generating may include generating the first data matrix through the M-th data matrix, each having K rows and N/K columns by extracting bits at an interval of K bits for each of the first data through the M-th data.

The sequentially outputting may include sequentially outputting an L-th row of each of the first data matrix through the M-th data matrix in an order from a case in which L is 1 to a case in which L is K.

According to another aspect, there is also provided an apparatus for processing data, the apparatus may include a first buffer configured to divide data into first data blocks of a first number of bits, a deinterleaver configured to perform deinterleaving on the first data blocks, and a second buffer configured to divide deinterleaved data into second data blocks of a second number of bits and output the second data blocks, wherein the first number of bits is determined based on a minimum switching unit of a deinterleaving operation and the second number of bits.

The second number of bits may be an input data unit of an LDPC decoder.

The first number of bits may be a common multiple of the minimum switching unit and the second number of bits.

The deinterleaver may be configured to input the first data blocks in sequence and realign inputted respective data blocks based on the minimum switching unit.

The deinterleaver may be configured to map bits having intervals of the minimum switching unit among bits of the respective data blocks to each row of a new data matrix.

The data may be data obtained by performing interleaving.

The apparatus may further include a decoder configured to decode the deinterleaved data.

According to another aspect, there is also provided an apparatus for processing data, the apparatus including a deinterleaving switch configured to receive first data through M-th data, each having N bits, N and M being natural numbers greater than or equal to 1 and generate a first data matrix through an M-th data matrix by extracting bits at an interval of K bits for each of the first data through the M-th data, K being a natural number greater than or equal to 1, and a memory configured to store the first data matrix through the M-th data matrix and sequentially output an L-th row of each of the first data matrix through the M-th data matrix, L being a natural number greater than or equal to 1.

N may be a multiple of K, and the deinterleaving switch may be configured to generate the first data matrix through the M-th data matrix, each having K rows and N/K columns by extracting bits at an interval of K bits for each of the first data through the M-th data.

The memory may be configured to sequentially output an L-th row of each of the first data matrix through the M-th data matrix in an order from a case in which L is 1 to a case in which L is K.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which:

FIG. 5 is a diagram illustrating a low-density parity-check (LDPC) decoder;

DETAILED DESCRIPTION

Figure 1:
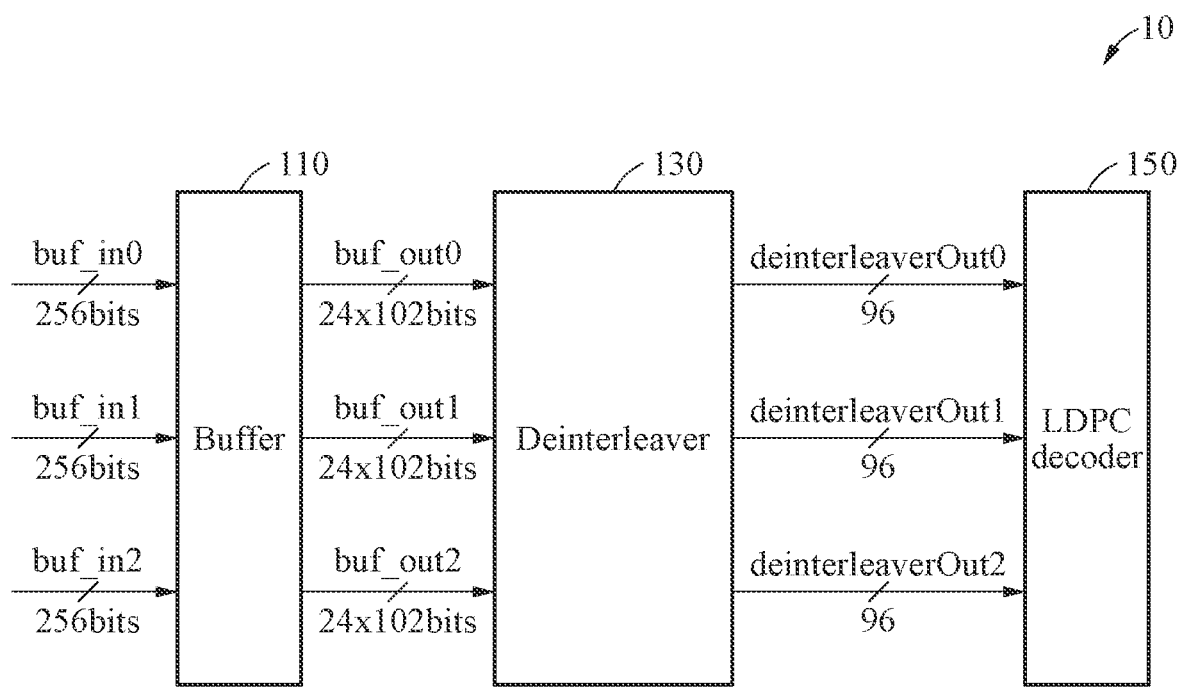
FIG. 1 is a diagram illustrating a deinterleaving system according to a related art.

Hereinafter, example embodiments will be described in detail with reference to the accompanying drawings. It should be understood, however, that there is no intent to limit this disclosure to the particular example embodiments disclosed. On the contrary, example embodiments are to cover all modifications, equivalents, and alternatives falling within the scope of the example embodiments.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Although terms of "first," "second," and the like are used to explain various components, the components are not limited to such terms. These terms are used only to distinguish one component from another component. For example, a first component may be referred to as a second component, or similarly, the second component may be referred to as the first component within the scope of the present disclosure.

Unless otherwise defined herein, all terms used herein including technical or scientific terms have the same meanings as those generally understood by one of ordinary skill in the art. Terms defined in dictionaries generally used should be construed to have meanings matching contextual meanings in the related art and are not to be construed as an ideal or excessively formal meaning unless otherwise defined herein.

Regarding the reference numerals assigned to the elements in the drawings, it should be noted that the same elements will be designated by the same reference numerals, wherever possible, even though they are shown in different drawings. Also, in the description of example embodiments, detailed description of well-known related structures or functions will be omitted when it is deemed that such description will cause ambiguous interpretation of the present disclosure.

Figure 2:
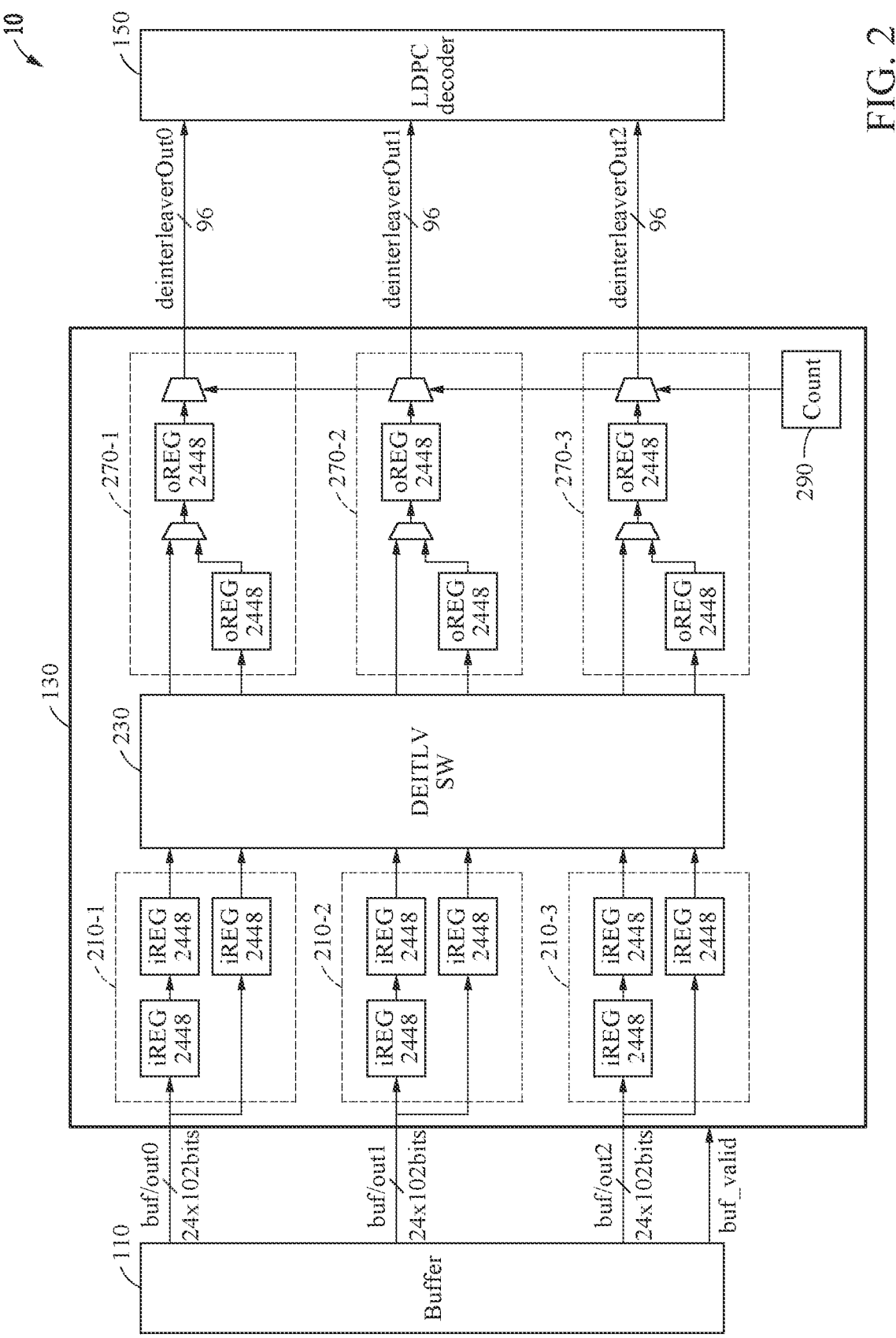
FIG. 2 is a block diagram illustrating a deinterleaver of FIG. 1.

FIG. 1 is a diagram illustrating a deinterleaving system according to a related art and FIG. 2 is a block diagram illustrating a deinterleaver of FIG. 1.

An interleaver (not shown) and a deinterleaver 130 may distribute a bit sequence in a bitstream to minimize an effect of a burst error generated during data transmission.

A decoder 150 may be an error-correction decoder. The decoder 150 may use an error correction code to correct an incorrect input value or bit occurring due to causes. When an amount of bits lost in an encoder (not shown) is within a defined limit bit range, the decoder 150 may perform an error correction function. In this instance, the encoder (not shown) may be an error correction encoder.

The decoder 150 may use an error correction code scheme of performing an error correction function for each block. When an error occurs in a form of a burst within a code block corresponding to a processing unit, the decoder 150 may not perform the error correction function due to an excess of a limit bit range to which processing is possible.

The interleaver (not shown) and the deinterleaver 130 may reduce the number of errors to be less than the number of limit processable bits by distributing the error generated in the form of the burst in a code block to another code block. That is, the interleaver (not shown) and the deinterleaver 130 may improve data transmission performance by allowing the error correction function of the decoder 150 to be executed normally.

The interleaver (not shown) may output a different bit sequence in a different order at the same width with respect to a bit sequence of a fixed width. The deinterleaver 130 may restore an original bit sequence order. The interleaver (not shown) and the deinterleaver 130 may be strictly paired to process a sequence.

Hereinafter, a deinterleaving system 10 for performing deinterleaving according to a related art will be described.

The deinterleaving system 10 may include a buffer 110, the deinterleaver 130, and the decoder 150.

For convenience of description, FIGS. 1 and 2 illustrate that the buffer 110, the deinterleaver 130, and the decoder 150 receive three data and output three data. However, embodiments are not limited thereto.

The buffer 110 may be a storage buffer for storing data used to deinterleave input data.

The buffer 110 may store data buf_in0 through buf_in2 received from a block (for example, an equalizer) corresponding to a front end of the deinterleaving system 10 and output data buf_out0 through buf_out2 of a predetermined bit unit. For example, the buffer 110 may receive the input data buf_in0 through buf_in2, each having 256 bits and output the data buf_out0 through buf_out2 of a 2448-bit unit.

The deinterleaver 130 may restore interleaved data.

The deinterleaver 130 may sequentially receive an input data sequence and store the received input data sequence in an input register to change an order arrangement of an input bit sequence.

The deinterleaver 130 may switch the data sequence stored in the input register according to the changed order arrangement, store the switched data sequence in an output register, and then output the stored data sequence sequentially.

Hereinafter, for convenience of description, it is assumed that the interleaving is performed on data based on a 12×1224 data matrix and the deinterleaver 130 performs deinterleaving based on an interleaved 1224×12 data matrix.

The deinterleaver 130 may include first register blocks 210-1 through 210-3, a deinterleaving switch 230, second register blocks 270-1 through 270-3, and a controller 290.

The first register blocks 210-1 through 210-3 may each include a plurality of registers iREG.

The first register blocks 210-1 through 210-3 may receive the input data buf_out0 through buf_out2 from the buffer 110 in units of 2448 bits. The first register blocks 210-1 through 210-3 may store the input data buf_out0 through buf_out2 in the register iREG through two stages.

The first register blocks 210-1 through 210-3 may output the input data to the deinterleaving switch 230.

The deinterleaving switch 230 may perform switching according to a predetermined order arrangement. For example, the deinterleaving switch 230 may perform the switching through signal lines on which switching and routing have been performed.

The deinterleaving switch 230 may output data on which the switching is performed to the second register blocks 270-1 through 270-3. For example, the deinterleaving switch 230 may output 2448-bit-unit data on which the switching is performed to the second register blocks 270-1 through 270-3.

The second register blocks 270-1 through 270-3 may each include a plurality of registers oREG and a plurality of multiplexers MUX. For example, the second register blocks 270-1 through 270-3 may include registers oREG of two stages.

The second register blocks 270-1 through 270-3 may output output data deinterleaverOut0 through deinterleaverOut3 according to an output sequence. For example, the second register blocks 270-1 through 270-3 may output the output data deinterleaverOut0 through deinterleaverOut3 of a 96-bit unit to a low-density parity-check (LDPC) decoder, for example, the decoder 150.

The LDPC decoder 150 may include a plurality of the same LDPC decoders. The LDPC decoder 150 may receive a plurality of pieces of data, for example, the output data deinterleaverOut0 through deinterleaverOut3 of the 96-bit unit and correct a data error.

The deinterleaver 130 may require a number of registers corresponding to the first register blocks 210-1 through 210-3 and the second register blocks 270-1 through 270-3. Also, the deinterleaving switch 230 may require a lot of hardware for routing since a connection line for switching is to be routed.

For example, as illustrated in FIG. 2, the deinterleaver 130 may require nine 2448-bit-unit registers iREG and six output registers oREG. Also, the deinterleaving switch 230 may require complex routing in units of 2448×6 bits for deinterleaving switching.

The deinterleaving system 10 may be difficult to be implemented on an FPGA that needs to be efficiently designed using available resources, and may be degraded in performance.

Figure 3:
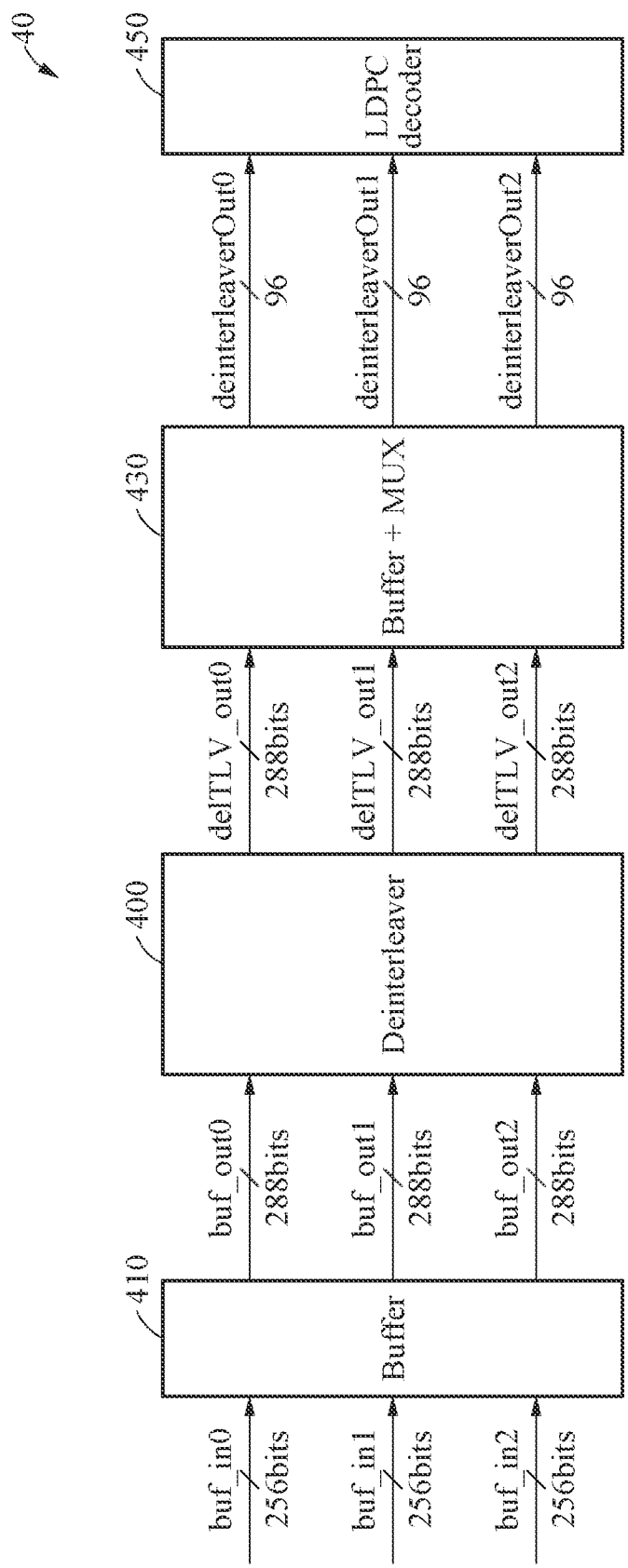
FIG. 3 is a diagram illustrating a deinterleaving system according to an example embodiment.
Figure 4:
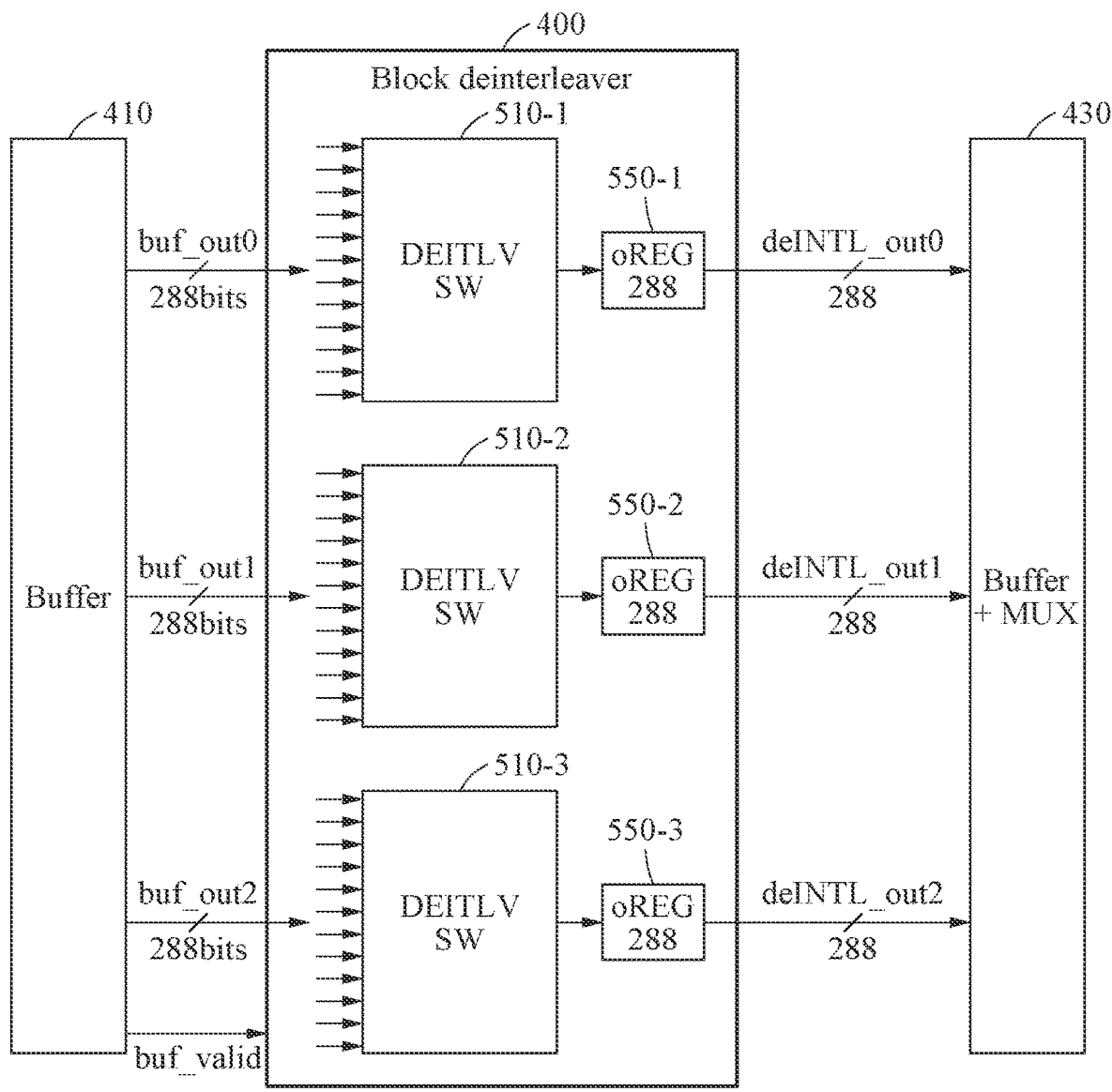
FIG. 4 is a block diagram illustrating a deinterleaver of FIG. 3.
Figure 5:
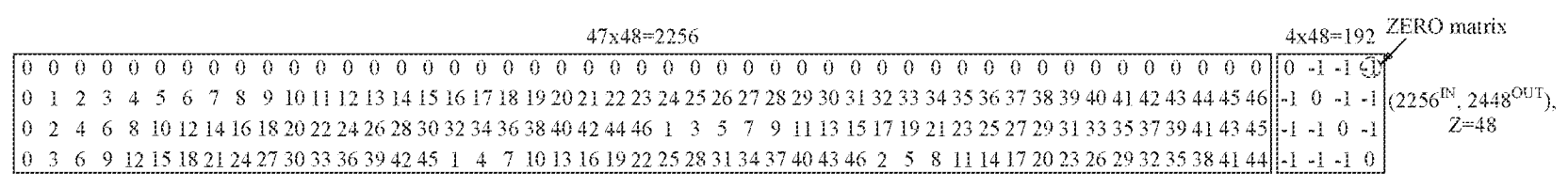

FIG. 3 is a diagram illustrating a deinterleaving system according to an example embodiment, FIG. 4 is a block diagram illustrating a deinterleaver of FIG. 3, and FIG. 5 is a diagram illustrating an LDPC decoder.

A deinterleaving system 40 may include a first buffer 410, a deinterleaver 400, a second buffer 430, and the decoder 150.

The deinterleaving system 40 may reduce routing of deinterleaving switching of the deinterleaver 400 by optimizing an input register column and an output register column, which may alleviate a degradation in deinterleaving performance.

For convenience of description, FIGS. 3 and 4 illustrate the first buffer 410, the deinterleaver 400, the second buffer 430, and an LDPC decoder 450 receive three data and output three data. However, embodiments are not limited thereto.

An LDPC encoder (not shown) may use a Quasi-cyclic LDPC (QC-LDPC) code for efficient encoding. For example, the LDPC encoder (not shown) may efficiently perform encoding using characteristics of a circulant matrix. The entire matrix for LDPC encoding may include a sub-matrix unit (for example, a Z×Z matrix unit) which is a unit of the circulant matrix, Z being a natural number greater than or equal to 1. FIG. 5 illustrates an LDPC encoding matrix obtained when a block length of a code word is 2448 bits and a coding rate is 47/51. In this case, Z is 48, that is, a Z value corresponding to a size of the submatrix.

The LDPC decoder 450 may process input data in units of a submatrix corresponding to Z set in an encoding process. Thus, the LDPC decoder 450 may receive Z-bit data as an input and perform decoding. Accordingly, the deinterleaver 130 may transfer data to the LDPC decoder 450 based on an input data unit (Z) of the LDPC decoder 450.

The deinterleaver 400 may perform deinterleaving switching. The deinterleaver 400 may deinterleave data that has been interleaved based on a C1×C2 arrangement, based on a C2×C1 arrangement, C1 and C2 being natural numbers greater than or equal to 1.

The deinterleaver 400 may perform switching in units of C2 as a minimum unit. For example, the deinterleaver 400 may perform switching by receiving C2-bit data as an input, and then perform switching by receiving subsequent C2-bit data.

The first buffer 410 may convert input data buf_in0 through buf_in2 into data buf_out0 through buf_out2 corresponding to k times the number (C2) of minimum unit data bits for deinterleaving. The first buffer 410 may output, to the deinterleaver 400, the data buf_out0 through buf_out2 obtained through the conversion. That is, the deinterleaver 400 may receive the data buf_out0 through buf_out2 of C2×k bits, k being a natural number greater than or equal to 1.

The deinterleaver 400 may receive the data buf_out0 through buf_out2 of C2×k bits, perform deinterleaving, and output the deinterleaved data to the second buffer 430. In this instance, the second buffer 430 may receive data deITLV_out0 through deLTLV_out2 of Z×m bits from the deinterleaver 400 as an input.

The second buffer 430 may output the data deinterleaverOut0 through deinterleaverOut2 corresponding to the input data unit (Z) of the LDPC decoder 150. For example, the second buffer 430 may include a multiplexer MUX, multiplex the received data deITLV_out0 through deITL- V_out2, and output the data deinterleaverOut0 through deinterleaverOut2 of Z bits to the LDPC decoder 450.

When Z×m is a multiple of C2, the deinterleaving system 40 may design the data buf_out0 through buf_out2 input to the deinterleaver 400 as data of Z×m bits.

For example, the deinterleaving system 40 may optimize the number of bits (Z×m) of the data buf_out0 through buf_out2 input to the deinterleaver 400 and the data deITL-V_out0 through deLTLV_out2 input to the second buffer 430 to be a common multiple of a minimum switching unit (C2) of the deinterleaver 400 and an input data processing unit (Z) of the LDPC decoder 450.

Hereinafter, as illustrated in FIGS. 3 and 4, the description is based on an assumption that the input data processing unit Z of the LDPC decoder 450 is 96 and the minimum switching unit C2 of the deinterleaver 400 is 12. For example, it is assumed that data is interleaved based on a 1224×12 arrangement so the deinterleaver 400 performs deinterleaving based on a 12×1224 arrangement.

The first buffer 410 may receive 256-bit input data buf_int0 through buf_out2 and output 288-bit output data buf_out0 through buf_out2 to the deinterleaver 400. In other words, the first buffer 410 may output the data buf_out0 through buf_out2 of 288 bits which is 24 times the minimum switching unit (12 bits) of the deinterleaver 400 to the deinterleaver 400.

FIGS. 3 and 4 illustrate that the first buffer 410 outputs the data buf_out0 through buf_out2 of 288 bits to the deinterleaver 400, and it is merely an example. The first buffer 410 may output data having the number of bits corresponding to a common multiple of the minimum switching unit (in this case, 12 bits) of the deinterleaver 400 and an input data processing unit (in this case, 96 bits) of the LDPC decoder 450.

The deinterleaver 400 includes deinterleaving switches 510-1 through 510-3 and registers 550-1 through 550-3.

The deinterleaving switches 510-1 through 510-3 may perform switching by receiving 12-bit data, and then perform switching by receiving subsequent 12-bit data. As such, the deinterleaving switches 510-1 through 510-3 may perform the switching by receiving the data buf_out0 through buf_out2 of 288 bits which is 24 times 12.

The deinterleaving switches 510-1 through 510-3 may output the switched data to the registers 550-1 through 550-3.

The registers 550-1 through 550-3 may store the switched data and output data deITLV_out0 through deITLV_out2 of a 288-bit unit to the second buffer 430.

The second buffer 430 may include a multiplexer MUX. In this case, the second buffer 430 may multiplex the switched 288-bit data deITLV_out0 through deITLV_out2 and output 96-bit data deinterleaverOut0 through deinterleaverOut2 to the LDPC decoder 450. In other words, the second buffer 430 may output the data deinterleaverOut0 through deinterleaverOut2 corresponding to the input data processing unit (96 bits) of the LDPC decoder 450 to the LDPC decoder 450.

The LDPC decoder 450 may correct an error of the data deinterleaverOut0 through deinterleaverOut2 corresponding to the input data processing unit (96 bits).

The deinterleaving system 40 may include the first buffer 410 and the second buffer 430 at the front end and the rear end of the deinterleaver 400, respectively. The first buffer 410 may output data having the number of bits corresponding to a minimum unit for deinterleaving switching. The second buffer 430 may convert the number of deinterleaver output data bits based on minimum unit data to be input to the LDPC decoder 450 after the deinterleaving switching.

The deinterleaving system 40 may design based on the data bit of the minimum unit for deinterleaving, thereby reducing the number of switching and routing for deinterleaving.

Figure 6:
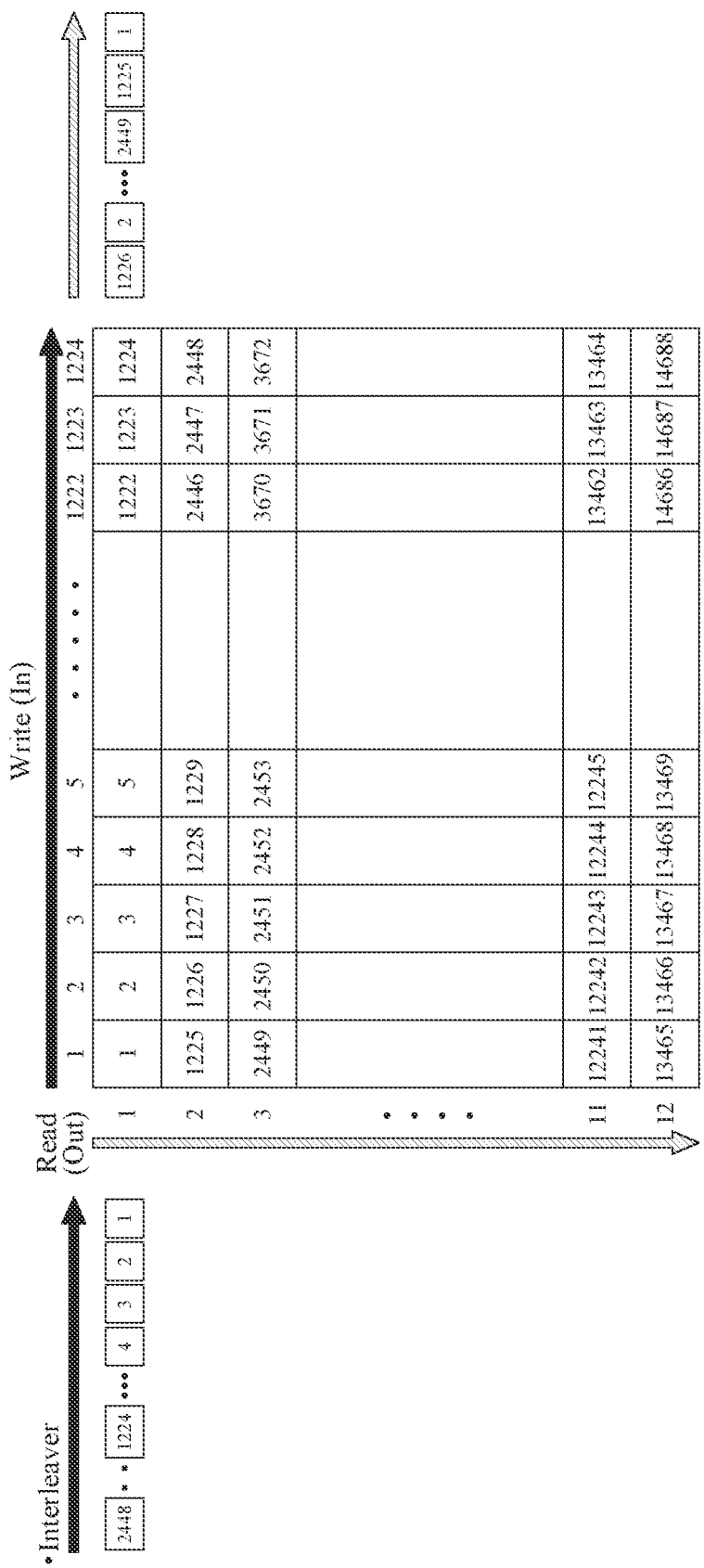
FIG. 6 is a diagram illustrating an interleaving operation.

FIG. 6 is a diagram illustrating an interleaving operation.

For describing an interleaving operation, it is assumed that an interleaver (not shown) has sequentially stored a 1224×12 data matrix to be interleaved in a virtual memory in row order. In this instance, the interleaver (not shown) may perform interleaving by reading out the stored data matrix in column order.

As illustrated in FIG. 6, the interleaver (not shown) may sequentially map first 1224 bits (1 through 1224) to a first row and sequentially map second 1224 bits (1225 through 2448) to a second row. Likewise, the interleaver (not shown) may map up to 12-th 1224 bits (13465 through 14688) to a 12-th row.

The interleaver (not shown) may perform the interleaving by reading the stored data matrix in column order. For example, the interleaver (not shown) may sequentially read a first column to read bits in an order of 1, 1225, 2449, . . . , 12241, 13465, and then read sequentially from a second column to a twelfth column, thereby performing the interleaving.

Figure 7:
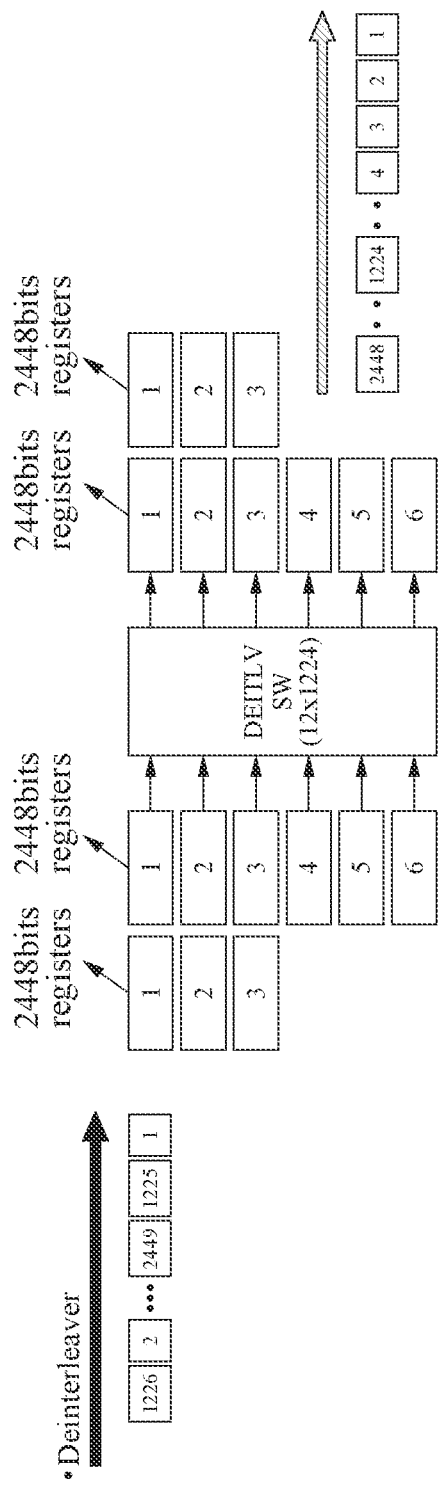
FIGS. 7 and 8 are diagrams illustrating an operation of the deinterleaver of FIG. 1.
Figure 8:
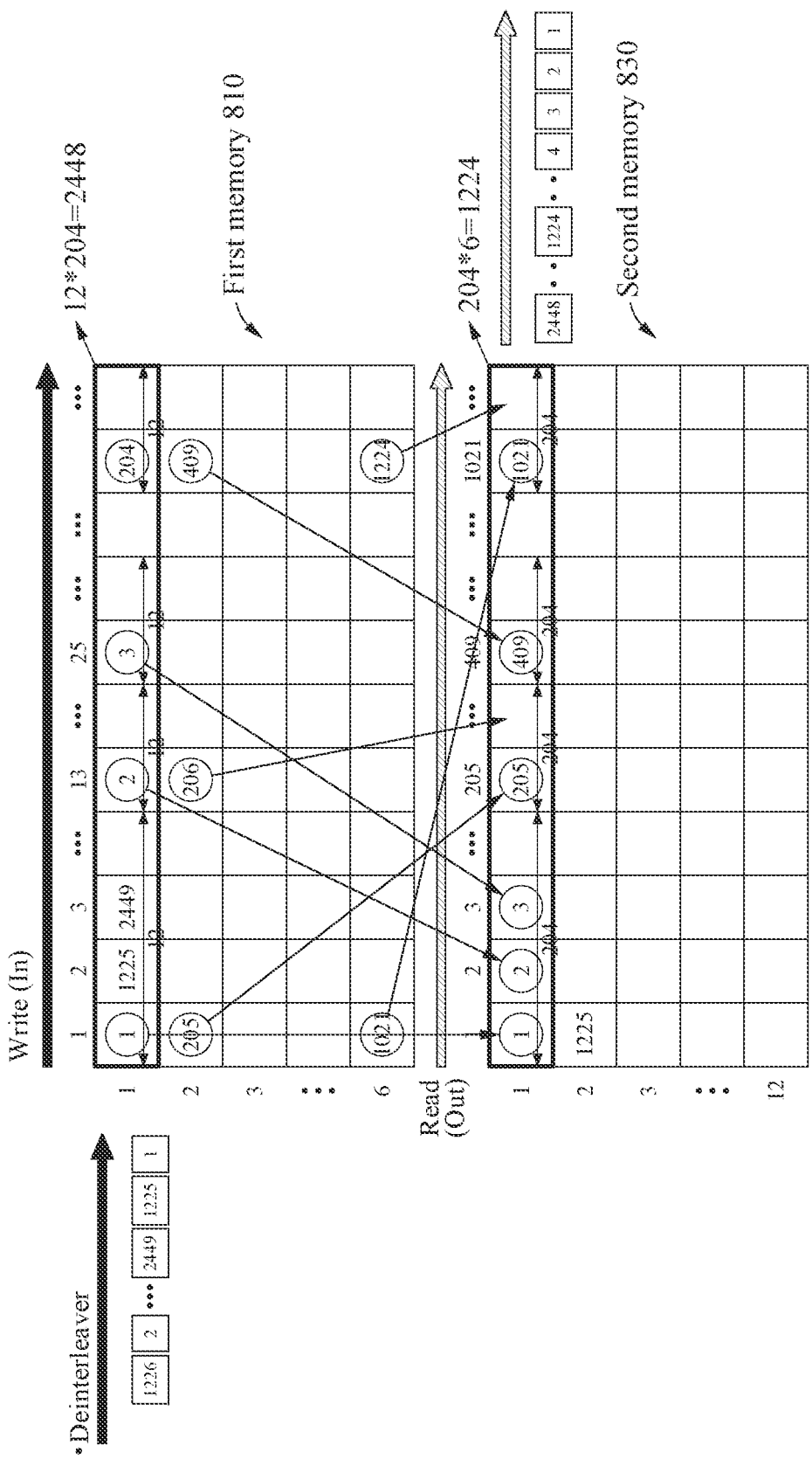
Figure 9:
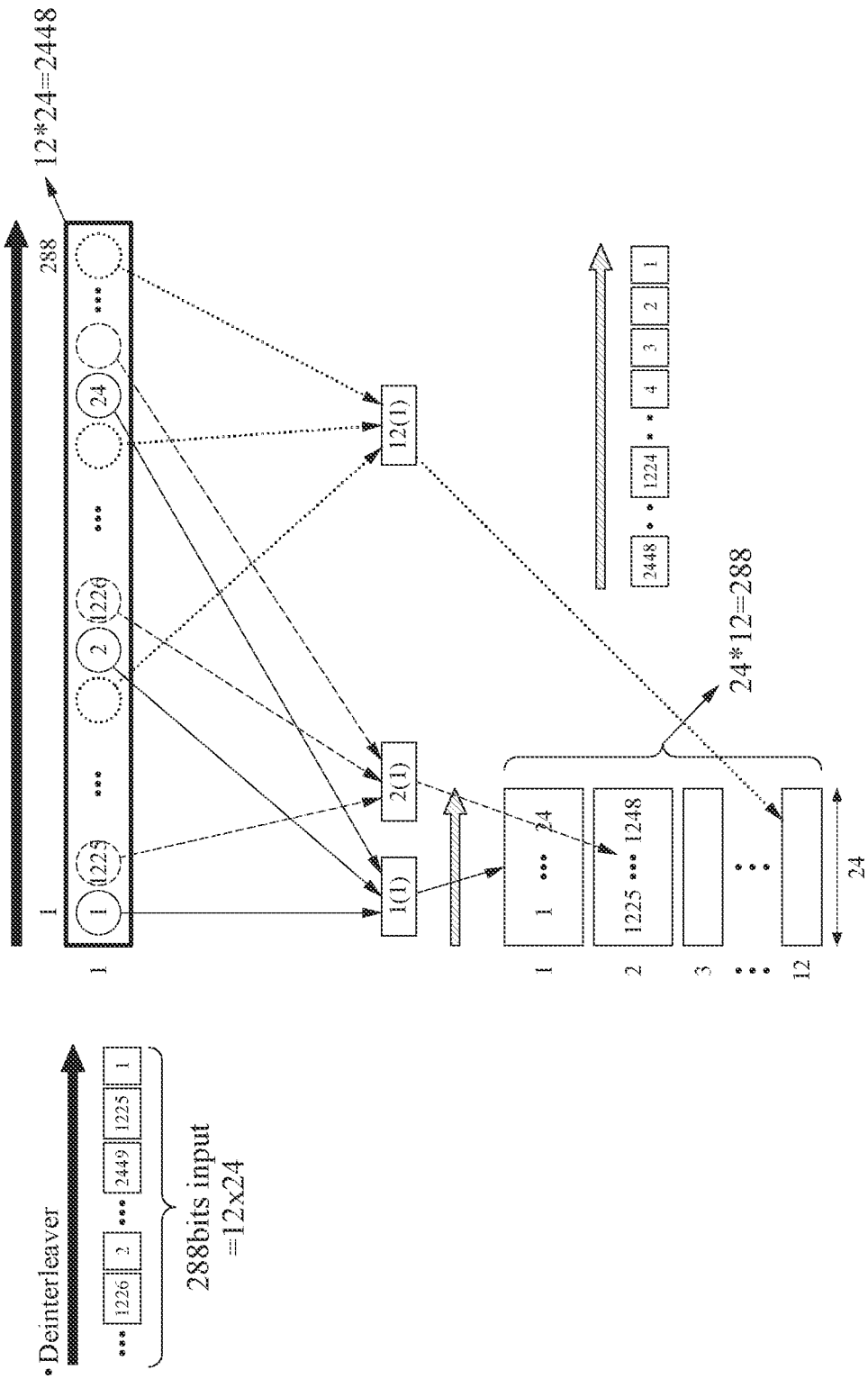
FIG. 9 is a diagram illustrating an operation of the deinterleaver of FIG. 4.

FIGS. 7 and 8 are diagrams illustrating operations of the deinterleaver of FIG. 1, and FIG. 9 is a diagram illustrating an operation of the deinterleaver of FIG. 4.

The deinterleaving systems 10 and 40 may restore a data bitstream by performing a deinterleaving process on data bits at intervals of 12 bits.

The deinterleaving systems 10 and 40 may restore interleaved data using a virtual memory corresponding to a 12×1224 matrix.

First, a deinterleaving operation of the existing deinterleaving system 10 is described with reference to FIGS. 7 and 8.

The deinterleaver 130 may sequentially store data of 14688 (=12×1224) bits in a first memory 810 having a size of 2448×6 at intervals of 2448 (=12×204) bits for each row. That is, the deinterleaver 130 may store data of 2448 bits in one row of the first memory 810. The deinterleaver 130 may extract data at intervals of 12 bits from one row of the first memory 810 and store the extracted data in a second memory 830, for example, a virtual memory having a size of 1224×12. For example, the deinterleaver 130 may store 204 pieces of data (1, 2, . . . , 204) extracted from a first row of the first memory 810 in positions 1 through 204 of the first row of the second memory 830, and then store 204 pieces of data (205, 206, . . . , 409) extracted from a second row of the first memory 810 in sequence continually in the second memory 830. Through this, the deinterleaver 130 may store 204 pieces of data (1021, 1022, . . . , 1224) of up to a sixth row of the first memory 810 in positions of 1021 through 1224 of the first row of the second memory 830.

Accordingly, the deinterleaver 130 may sequentially store data from 1 to 1224 in the first row of the second memory 830 in an order of data before interleaving.

The deinterleaver 130 may restore a data sequence by reading all twelve rows sequentially in a second memory 830 having the size of 1224×12.

Hereinafter, a deinterleaving operation of the deinterleaving system 40 will be described with reference to FIG. 9.

The deinterleaver 400 may perform deinterleaving by receiving data of a number of bits based on a unit of the number of bits of data input to the LDPC decoder 450.

FIG. 9 illustrates that the deinterleaver 400 receives data of 288 bits, but embodiments are not limited thereto. For example, the deinterleaver 400 may receive data having the number of bits corresponding to a common multiple of a minimum switching unit (in this case, 12 bits) of the deinterleaver 400 and an input data processing unit (in this case, 96 bits) of the LDPC decoder 450.

The deinterleaver 400 may convert (or realign) 1×288 data into a 12×24 data matrix by selecting (or extracting) data at intervals of 12 bits from the received 288-bit data. For example, the deinterleaver 400 may map bits having a 12-bit interval among the 288-bit data to each row of new memory having a size of 12×24.

The deinterleaver 400 may sequentially perform the above-described conversion on the received 288-bit data and store them in the second buffer 430 in sequence. For example, the deinterleaver 400 may convert received first data through 51-th data of 288 bits into a first data matrix through a 51-th data matrix having the size of 12×24 and store the first data matrix through the 51-th data matrix in the second buffer 430.

The second buffer 430 may output each row of the stored data matrix in sequence. For example, the second buffer 430 may sequentially output first rows of the first data matrix through the 51-th data matrix having the size of 12×24, and then sequentially output second rows of the first data matrix through the 51-th data matrix. The second buffer 430 may restore data by output up to 12-th columns of the first data matrix through the 51-th data matrix sequentially.

Since the existing deinterleaving system 10 may store 2448-bit data in six registers and perform switching at once, complex routing for 2448×6 switching is required. In contrast, since the deinterleaving system 40 divides 288-bit data into twelve 24-bit data and performs switching for 288 bits, the number of routings may be significantly reduced.

Table 1 shows results obtained by designing and synthesizing the existing deinterleaving system 10 in a field-programmable gate array (FPGA). Table 2 shows results obtained by designing and synthesizing the deinterleaving system 40 in an FPGA.

In terms of the existing deinterleaving system 10, in addition to the deinterleaver 130, as the number of bits processed in the deinterleaver 130 increases, the number of bits stored in the buffer 110 increases. Thus, along with the deinterleaver 130, a lot of lookup tables and registers of the buffer 110 may be used.

In terms of the deinterleaving system 40, in addition to the simplified design of the deinterleaver 400, it can be seen that sizes of LUT and Register of buffer blocks (for example, the first buffer 410 and the second buffer 430) located at the front end and the rear end of the deinterleaver 400 are significantly reduced in response to the number of input and output data bits being reduced.

TABLE 1

|  | LUT | Registers |
| --- | --- | --- |
| Deinterleaver block | 29,939 | 185,145 |
| Buffer block | 358,328 | 109,855 |

TABLE 2

|  | LUT | Registers |
| --- | --- | --- |
| Deinterleaver block | 0 | 4,332 |
| Buffer block | 41,887 | 74,645 |

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The methods according to the above-described example embodiments may be recorded in non-transitory computer-readable media including program instructions to implement various operations of the above-described example embodiments. The media may also include, alone or in combination with the program instructions, data files, data to structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A method of processing data, the method comprising:
in a system including a decoder and a plurality of buffers,
by a first buffer of the plurality of buffers, the first buffer storing data to be processed for error correction, dividing the data to be processed for error correction into first data blocks of a first number of bits;
performing deinterleaving on the first data blocks;
dividing deinterleaved data into second data blocks of a second number of bits and outputting the second data blocks to a second buffer of the plurality of buffers;
by the second buffer, outputting the second data blocks to the decoder; and
by the decoder, performing error correction on the second data blocks;
wherein the first number of bits is determined based on a minimum switching unit of a deinterleaving operation and the second number of bits.

2. The method of claim 1, wherein
the second number of bits is an input data unit of the decoder, and
the decoder is a low-density parity-check (LDPC) decoder.

3. The method of claim 1, wherein the first number of bits is a common multiple of the minimum switching unit and the second number of bits.

4. The method of claim 1, wherein the performing comprises:
inputting the first data blocks in sequence; and
realigning inputted respective data blocks based on the minimum switching unit.

5. The method of claim 4, wherein the realigning comprises:
mapping bits having intervals of the minimum switching unit among bits of the respective data blocks to each row of a new data matrix.

6. The method of claim 1, wherein the data is data obtained by performing interleaving.

7. The method of claim 1, wherein the method further comprising:
inputting first data through M-th data, each having N bits, N and M being natural numbers greater than or equal to 1;
generating a first data matrix through an M-th data matrix by extracting bits at an interval of K bits for each of the first data through the M-th data, K being a natural number greater than or equal to 1; and
sequentially outputting an L-th row of each of the first data matrix through the M-th data matrix, L being a natural number greater than or equal to 1.

8. The method of claim 7, wherein N is a multiple of K, and
the generating comprises:
generating the first data matrix through the M-th data matrix, each having K rows and N/K columns by extracting bits at an interval of K bits for each of the first data through the M-th data.

9. The method of claim 7, wherein the sequentially outputting comprises:
sequentially outputting an L-th row of each of the first data matrix through the M-th data matrix in an order from a case in which L is 1 to a case in which L is K.

10. An apparatus for processing data, the apparatus comprising:
a first buffer configured to divide data to be processed for error correction into first data blocks of a first number of bits;
a deinterleaver configured to perform deinterleaving on the first data blocks;
a second buffer configured to divide deinterleaved data into second data blocks of a second number of bits and output the second data blocks to a decoder; and
a decoder configured to perform error correction on the second data blocks,
wherein the first number of bits is determined based on a minimum switching unit of a deinterleaving operation and the second number of bits.

11. The apparatus of claim 10, wherein
the second number of bits is an input data unit of the decoder, and
the decoder is a low-density parity-check (LDPC) decoder.

12. The apparatus of claim 10, wherein the first number of bits is a common multiple of the minimum switching unit and the second number of bits.

13. The apparatus of claim 10, wherein the deinterleaver is configured to input the first data blocks in sequence and realign inputted respective data blocks based on the minimum switching unit.

14. The apparatus of claim 13, wherein the deinterleaver is configured to map bits having intervals of the minimum switching unit among bits of the respective data blocks to each row of a new data matrix.

15. The apparatus of claim 10, wherein the data is data obtained by performing interleaving.

* * * * *